US008237283B2

(12) United States Patent
Chandra et al.

(10) Patent No.: US 8,237,283 B2
(45) Date of Patent: Aug. 7, 2012

(54) STRUCTURE AND METHOD OF REDUCING ELECTROMIGRATION CRACKING AND EXTRUSION EFFECTS IN SEMICONDUCTOR DEVICES

(75) Inventors: Kaushik Chandra, Fishkill, NY (US); Ronald G. Filippi, Wappingers Falls, NY (US); Wai-Lin Li, Beacon, NY (US); Ping-Chuan Wang, Hopewell Junction, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 908 days.

(21) Appl. No.: 11/758,206

(22) Filed: Jun. 5, 2007

(65) Prior Publication Data
US 2008/0303164 A1    Dec. 11, 2008

(51) Int. Cl.
*H01L 23/52* (2006.01)
(52) U.S. Cl. ........ 257/773; 257/758; 257/750; 257/760; 257/211; 257/774; 257/E23.134
(58) Field of Classification Search .................. 257/773, 257/758, E23.134, 750, 760, 775, 211, 744
See application file for complete search history.

(56) References Cited

U.S. PATENT DOCUMENTS

| 4,742,014 A | 5/1988 | Hooper et al. |
| 5,514,974 A | 5/1996 | Bouldin |
| 5,689,139 A | 11/1997 | Bui et al. |
| 5,712,510 A | 1/1998 | Bui et al. |
| 5,789,315 A | 8/1998 | Besser et al. |
| 5,818,110 A | 10/1998 | Cronin |
| 5,847,461 A | 12/1998 | Xu et al. |
| 5,863,832 A * | 1/1999 | Doyle et al. ................. 438/622 |
| 6,157,081 A | 12/2000 | Nariman et al. |
| 6,383,920 B1 | 5/2002 | Wang et al. |
| 6,417,572 B1 | 7/2002 | Chidambarrao et al. |
| 6,576,848 B1 | 6/2003 | Cronin et al. |
| 6,594,894 B1 | 7/2003 | Bernstein et al. |
| 6,598,182 B1 | 7/2003 | Lowitz et al. |
| 6,720,261 B1 | 4/2004 | Anderson et al. |
| 6,821,886 B1 | 11/2004 | Layadi et al. |
| 6,909,293 B2 | 6/2005 | Kim |
| 7,047,053 B2 | 5/2006 | Lee |
| 7,119,545 B2 | 10/2006 | Ahsan et al. |
| 2006/0088947 A1* | 4/2006 | Lien et al. ........................ 438/3 |
| 2007/0218677 A1* | 9/2007 | Engelhardt et al. ........... 438/618 |

* cited by examiner

*Primary Examiner* — Lynne A Gurley
*Assistant Examiner* — Junghwa M Im
(74) *Attorney, Agent, or Firm* — Cantor Colburn LLP; Ian MacKinnon

(57) ABSTRACT

A structure for reducing electromigration cracking and extrusion effects in semiconductor devices includes a first metal line formed in a first dielectric layer; a cap layer formed over the first metal line and first dielectric layer; a second dielectric layer formed over the cap layer; and a void formed in the second dielectric layer, stopping on the cap layer, wherein the void is located in a manner so as to isolate structural damage due to electromigration effects of the first metal line, the effects including one or more of extrusions of metal material from the first metal line and cracks from delamination of the cap layer with respect to the first dielectric layer.

13 Claims, 5 Drawing Sheets (a)

STRUCTURE AND METHOD OF REDUCING ELECTROMIGRATION CRACKING AND EXTRUSION EFFECTS IN SEMICONDUCTOR DEVICES

BACKGROUND

The present invention relates generally to semiconductor device manufacturing processes and, more particularly, to a structure and method of reducing electromigration cracking and extrusion effects in semiconductor devices.

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to deleterious effects such as electromigration.

Electromigration is a term referring to the phenomenon of mass transport of metallic atoms (e.g., copper or aluminum) which make up the interconnect material, as a result of unidirectional or DC electrical current conduction therethrough. More specifically, the electron current collides with the metal ions, thereby pushing them in the direction of current travel. Over an extended period of time, the accumulation of metal at the anode end of the interconnect material significantly increases the local mechanical stress in the system. This in turn may lead to delamination, cracking, and even metal extrusion from the metal wire, thereby causing an electrical short to adjacent interconnects. Electromigration becomes increasingly more significant in integrated circuit design, as relative current densities through metallization lines continue to increase as the linewidth dimensions shrink.

For example, FIG. 1 illustrates a scanning electron micrograph (SEM) cross-sectional image of a test structure 100 taken near the anode end of a failed interconnect line 102 included therein, as a result of electromigration stress. The current carrying interconnect line 102 is disposed between the adjacent "extrusion monitor" lines 104a, 104b, that do not carry current. As indicated above, there are two phenomena associated with the illustrated electromigration fail. First, a metal/cap layer interface is delaminated by the high stress, with the delamination spanning across the gap between adjacent wire 104b. Second, metal extrusion of line 102 occurs and reaches the adjacent wire 104a, causing an electrical short.

Although electromigration-induced extrusion failure is not particularly prevalent in previous technologies using silicon dioxide ($SiO_2$) and dense SiCOH (carbon doped oxide) as dielectric materials (and was generally treated as irrelevant since extrusion typically occurs long after an initial electromigration failure, defined by 20% resistance increase), this phenomenon has been more frequently observed during the evaluation of advanced technologies using ultra low-K dielectrics. A low-k dielectric material is one in which the relative dielectric constant is less than 4, while an ultra low-k dielectric is one in which the relative dielectric constant is less than 3. Accordingly, it would be desirable to be able to minimize the adverse impacts of extrusion/delamination related damage associated with the electromigration phenomenon.

SUMMARY

The foregoing discussed drawbacks and deficiencies of the prior art are overcome or alleviated, in an exemplary embodiment, by a structure for reducing electromigration cracking and extrusion effects in semiconductor devices, including a first metal line formed in a first dielectric layer; a cap layer formed over the first metal line and first dielectric layer; a second dielectric layer formed over the cap layer; and a void formed in the second dielectric layer, stopping on the cap layer, wherein the void is located in a manner so as to isolate structural damage due to electromigration effects of the first metal line, the effects including one or more of extrusions of metal material from the first metal line and cracks from delamination of the cap layer with respect to the first dielectric layer.

In another embodiment, a semiconductor device structure includes a first wiring level, the first wiring level comprising a first metal line formed in a first dielectric layer, and a second metal line formed in the first dielectric layer, adjacent the first metal line; a first cap layer formed over the first wiring level; and a second wiring level formed over the first cap layer, the second wiring level comprising a second dielectric layer, a void formed in the second dielectric layer, stopping on the cap layer, and sealing dielectric material formed over the second cap layer, the sealing dielectric material configured to pinch off upper portions of the void while maintaining lower portions of the void; wherein the void is located in a manner so as to isolate structural damage due to electromigration effects of the first metal line, the effects including one or more of extrusions of metal material from the first metal line and cracks from delamination of the first cap layer with respect to the first dielectric layer.

In another embodiment, a method of reducing electromigration cracking and extrusion effects in semiconductor devices includes forming a first metal line in a first dielectric layer; forming a cap layer over the first metal line and first dielectric layer; forming a second dielectric layer over the cap layer; and forming a void formed in the second dielectric layer, stopping on the cap layer, wherein the void is located in a manner so as to isolate structural damage due to electromigration effects of the first metal line, the effects including one or more of extrusions of metal material from the first metal line and cracks from delamination of the cap layer with respect to the first dielectric layer.

BRIEF DESCRIPTION OF THE DRAWINGS

Referring to the exemplary drawings wherein like elements are numbered alike in the several Figures.

DETAILED DESCRIPTION

Disclosed herein is a structure and method of reducing electromigration cracking and extrusion effects in semiconductor devices. Briefly stated, a small opening is intentionally formed within an insulating dielectric layer between interconnects (specifically, near the anode region of the interconnects), which serves as a local crack stop to avoid crack propagation, as well as a reservoir to accommodate metal extrusion induced by electromigration. In so doing, any such extrusions are contained within the gap and thus prevented from creating shorts to adjacent interconnect lines. Further, any delamination/cracking at the anode end of the interconnect metal is contained at the gap, and prevented from being spread any further into the dielectric material.

Figure 1:
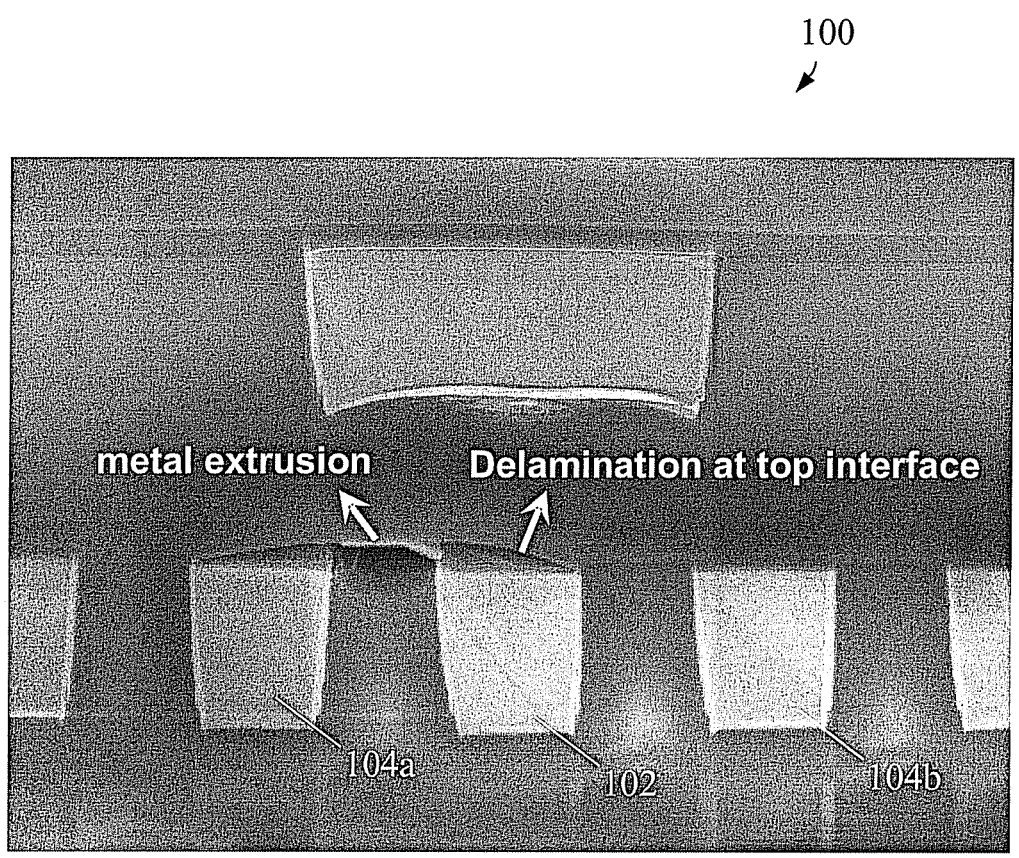
FIG. 1 is a scanning electron micrograph (SEM) cross-sectional image of a test structure taken near the anode end of a failed interconnect line, as a result of electromigration stress.
Figure 2A:
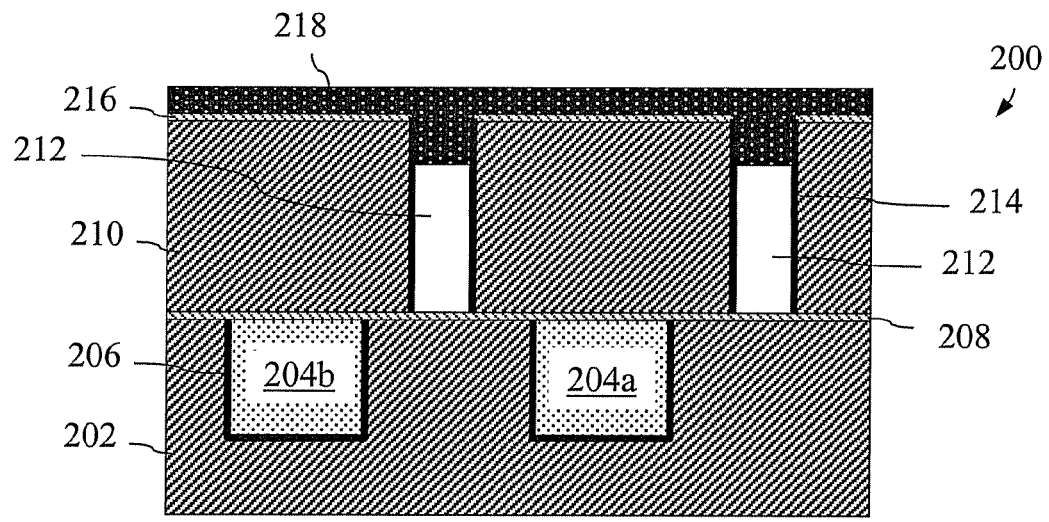
FIG. 2(a) is a cross-sectional view of a structure for reducing electromigration cracking and extrusion effects in semiconductor devices, in accordance with an embodiment of the invention.

Referring now to FIG. 2(a), there is shown a cross-sectional view of a semiconductor device 200, including a structure for reducing electromigration cracking and extrusion effects in semiconductor devices, in accordance with an embodiment of the invention. As shown therein, a first dielectric layer 202 (e.g., $SiO_2$, SiCOH, low-K material, etc.) has metal interconnect lines 204a, 204b formed therein, representing a lower wiring level. The interconnect lines 204a, 204b include a suitable semiconductor metal wiring material such as, for example, aluminum, copper, gold, silver and alloys thereof, and is also surrounded on the bottom and sides thereof with one or more diffusion barrier layers 206 (e.g., TaN, Ta, TiN, Ti, Ru, RuTa, etc.). The interconnect lines 204a, 204b, and first dielectric layer 202 are further covered with a dielectric cap material 208 (e.g., $Si_3N_4$, SiC, SiCN, SiCH, etc.). To this point, the semiconductor structure 200 is formed in accordance with processing techniques known in the art.

In the example illustrated, only the interconnect line 204a is assumed to be susceptible to electromigration induced damage (i.e., conducts current in a single direction, where the anode end of the line 204a is shown in the figure). A second dielectric layer 210 is formed over the cap layer 208, representing an upper wiring level. For purposes of simplicity, no interconnect lines are depicted in the second dielectric layer 210, although it will be appreciated that such lines may be formed in that layer. Because line 204a in the first dielectric layer 202 is susceptible to electromigration induced extrusions and cracking, a void (gap) 212 is intentionally formed within dielectric layer 210 around the anode end of line 204a, the void 212 landing on top of the cap layer 208. At least a portion of the void 212 is located between interconnect 204a and adjacent interconnect 204b.

As discussed in further detail herein, the void 212 may be lined with an optional liner/pore-sealing material 214 once the void 212 has been initially patterned after an upper level wiring cap layer 216 is formed over dielectric 210. Then, a sealing dielectric material 218 is used to pinch off the upper portions of the void 212 before additional layers are formed in accordance with existing processes of record.

Figure 2B:
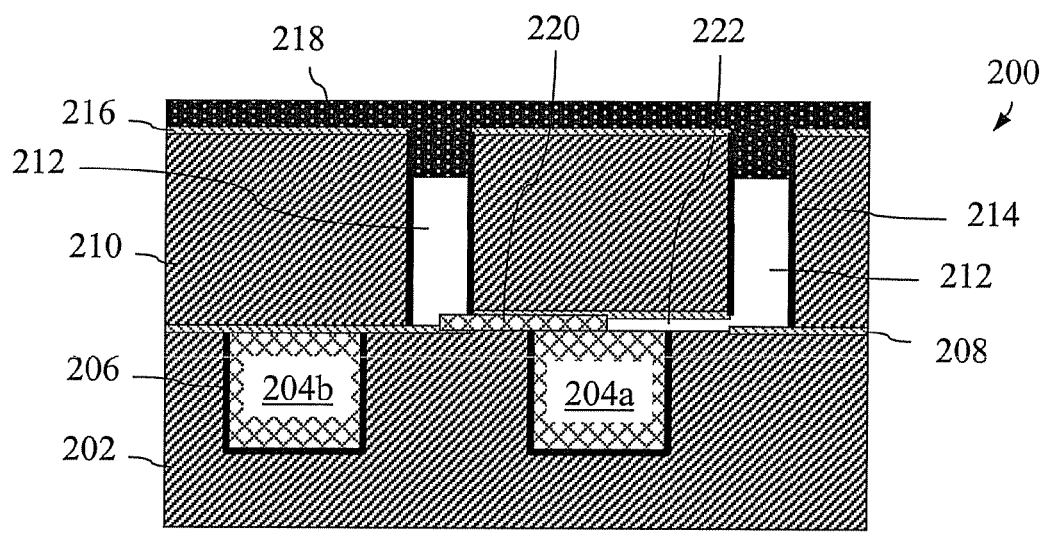
FIG. 2(b) illustrates the operation of the structure of FIG. 2(a), with respect to containment of an electromigration induced extrusion and delamination defect.

FIG. 2(b) illustrates the operation of the structure of FIG. 2(a), with respect to containment of an electromigration induced extrusion and delamination defect. As is shown, electromigration-induced extrusion 220 is depicted in the anode region of interconnect 204a, extending in the direction of adjacent interconnect wire 204b. However, the metal extrusion 220 is contained within the left portion of the void 212 shown in FIG. 2(b) and does not short to the adjacent 204b. Moreover, a delamination 222 of the interconnect metal and cap layer 208 is also confined by the right portion of the void 212 around the stressed wire 204a and does not propagate further into any adjacent wires within the first dielectric layer 202.

Figure 3:
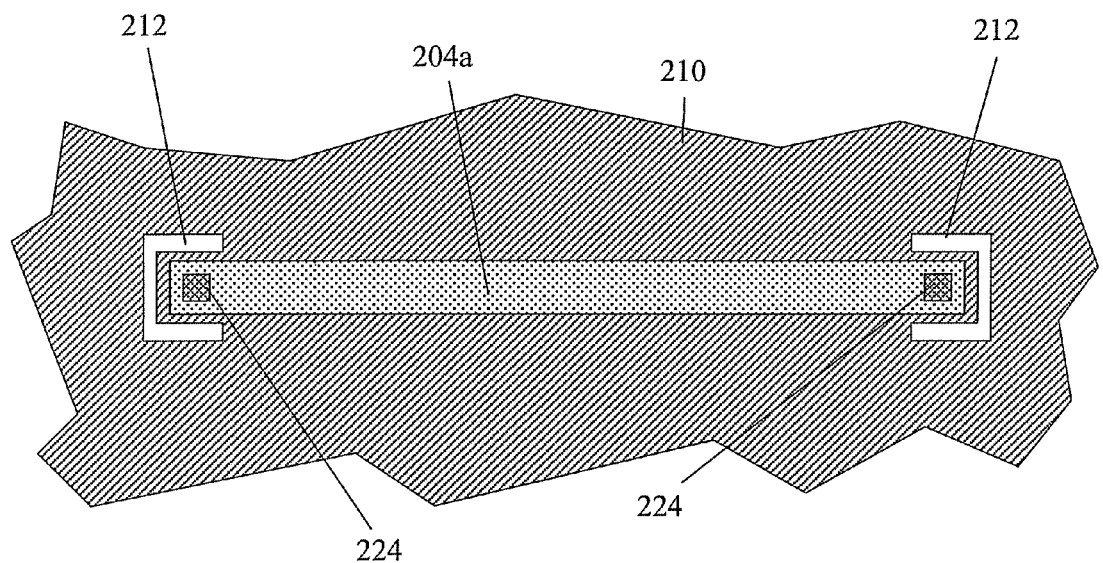
FIG. 3 is a top view of the structure of FIG. 2(a)

Referring now to FIG. 3, there is shown a top view of the exemplary structure of FIG. 2(a). In the example depicted, the void 212 is formed locally around the ends of the interconnect structure 204a where extrusions occur, so as minimize space restrictions. For ease of illustration, the cap layer 208 is not depicted in FIG. 3. In addition, FIG. 3 also illustrates the formation of vias 224 formed above (or below) the interconnect 204a, for connection to upper (or lower) wiring levels. In the event that it is known ahead of time which end of the line 204a is the anode end, then the void 212 can be even further localized to that specific end. Alternatively, the void could 212 also be formed on the cap layer (not shown in FIG. 3) above the interconnect line 204a in a manner so as to surround the interconnect line 204a.

Figure 4A:
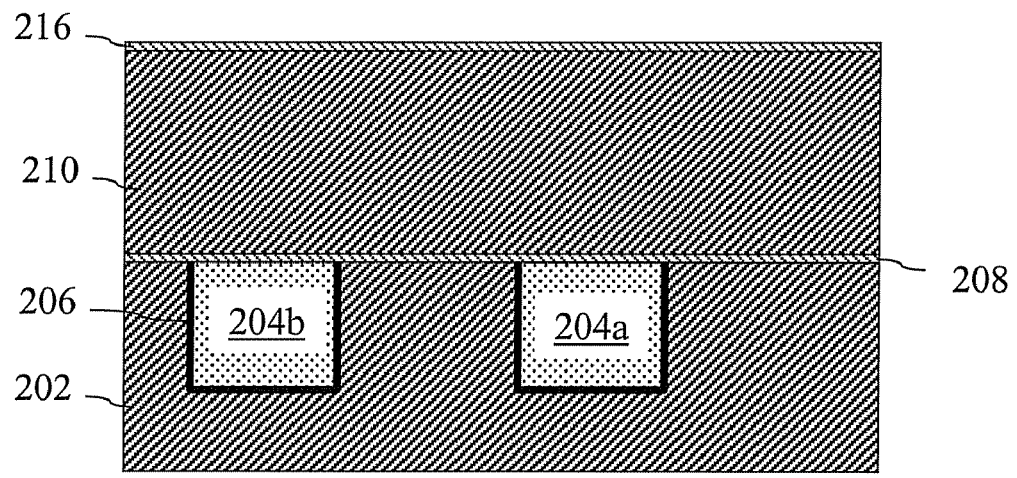
FIGS. 4(a) through 4(d) are a sequence of cross-sectional views illustrating an exemplary process flow for forming the structure of FIG. 2(a), in accordance with a further embodiment of the invention.
Figure 4B:
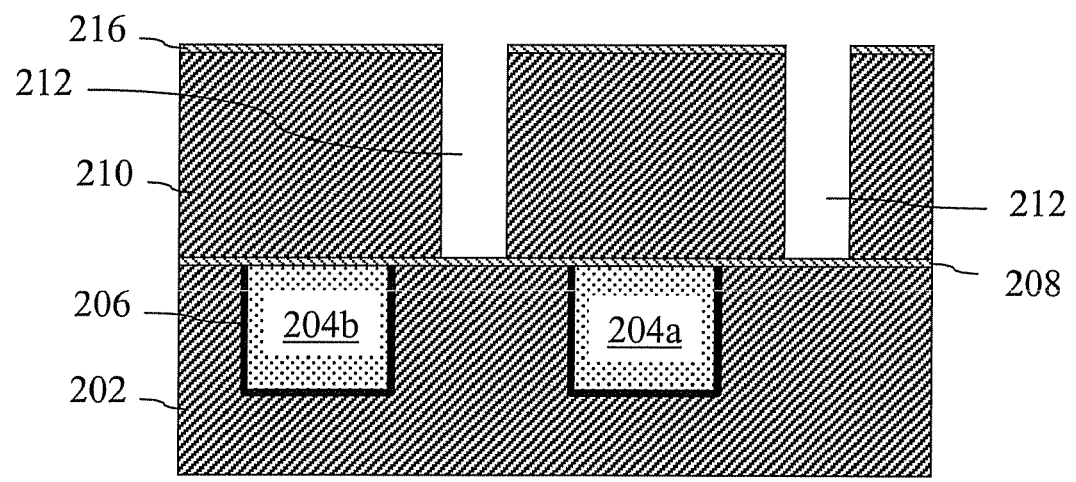

Finally, FIGS. 4(a) through 4(d) are a sequence of cross-sectional views illustrating an exemplary process flow for forming the structure of FIG. 2(a), in accordance with a further embodiment of the invention. In FIG. 4(a), the lower wiring level (dielectric layer 202, interconnect lines 204a, 204b, diffusion barrier 206 and cap layer 208) is formed, followed by the upper wiring level (dielectric layer 210, associated metal lines (not shown) and cap layer 216). The dielectric layer 210 in the upper metal level may be the same material as the dielectric layer 202 in the lower wiring level and can be applied, for example, by chemical vapor deposition (CVD) or a spin-on technique. Then, in FIG. 4(b), the void 212 around the anode end of the interconnect 204a is patterned in the dielectric layer through lithography and etching process, landing on the cap layer 208.

Figure 4C:
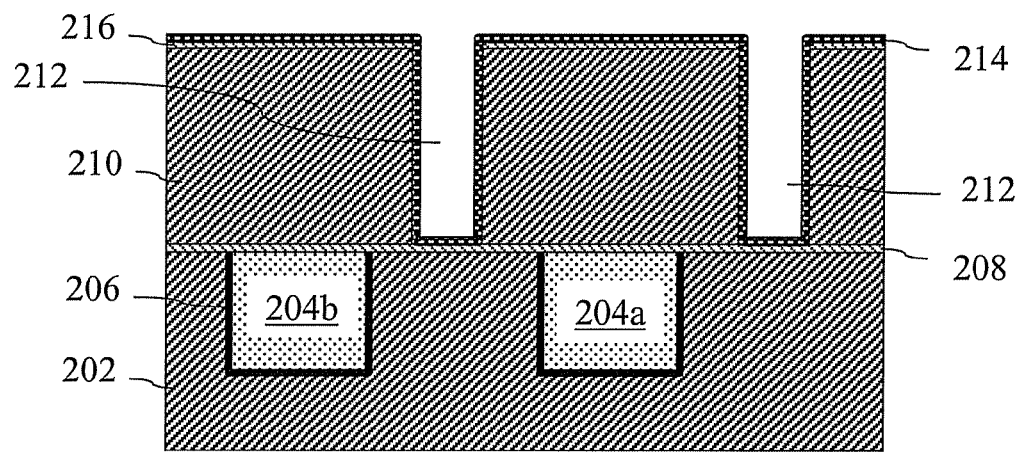
Figure 4D:
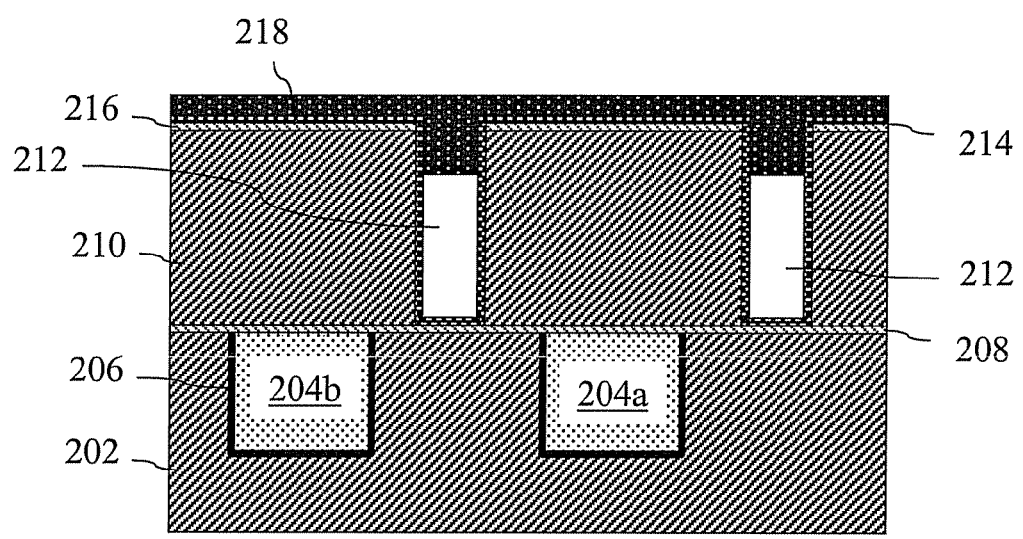

As then shown in FIG. 4(c), an optional pore-sealing liner material 214 is deposited over the upper wiring level and the sidewalls and bottom of the void 212. The pore-sealing liner material 214 may be desirable where the dielectric layer 210 is a porous material, such as porous SiCOH, for example. The pore-sealing liner material 214 may include the same material as used for the metal line diffusion barrier 206 (e.g., TaN, TiN, etc.) or could also be an oxide material. In any case, the sealing dielectric material 218 is then deposited in FIG. 4(d) in order to pinch off the upper portions of the voids 212. The sealing dielectric material 218 is deposited in a manner that maintains the integrity of the bottom of the voids 212 (i.e., does not completely fill the voids 212 with dielectric material). One suitable deposition method in this regard is through chemical vapor deposition (CVD).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A structure for reducing electromigration cracking and extrusion effects in semiconductor devices, comprising:
   a first metal line formed in a first dielectric layer;
   a cap layer formed over the first metal line and first dielectric layer;
   a second dielectric layer formed over the cap layer, the second dielectric layer comprising a porous, low-K material;
   a void formed in the second dielectric layer, with a bottom of the void stopping on the cap layer, wherein the void is located in a manner so as to isolate structural damage due to electromigration effects of the first metal line, the effects including one or more of extrusions of metal material from the first metal line and cracks from delamination of the cap layer with respect to the first dielectric layer;
a pore-sealing liner material formed on sidewall surfaces of the second dielectric layer that define the void; and
a sealing dielectric material formed over the second dielectric layer, the sealing dielectric material configured to pinch off upper portions of the void while maintaining lower portions of the void;
wherein the void is localized around an anode end of the first metal line so as to prevent extrusions from the anode end from shorting to an adjacent second metal line formed in the first dielectric layer.

2. A semiconductor device structure, comprising:
a first wiring level, the first wiring level comprising a first metal line formed in a first dielectric layer, and a second metal line formed in the first dielectric layer, adjacent the first metal line;
a first cap layer formed over the first wiring level;
a second wiring level formed over the first cap layer, the second wiring level comprising a second dielectric layer, a void formed in the second dielectric layer, with a bottom of the void stopping on the first cap layer, and a sealing dielectric material formed over the second cap layer, the sealing dielectric material configured to pinch off upper portions of the void while maintaining lower portions of the void;
the first and second dielectric layers comprising a porous, low-K material; and
a pore-sealing liner material formed on sidewall surfaces of the second dielectric layer that define the void;
wherein the void is located in a manner so as to isolate structural damage due to electromigration effects of the first metal line, the effects including one or more of extrusions of metal material from the first metal line and cracks from delamination of the first cap layer with respect to the first dielectric layer, and wherein the void is localized around an anode end of the first metal line so as to prevent extrusions from the anode end from shorting to the adjacent second metal line.

3. A structure for reducing electromigration cracking and extrusion effects in semiconductor devices, comprising:
a first metal line formed in a first dielectric layer;
a cap layer formed over the first metal line and first dielectric layer;
a second dielectric layer formed over the cap layer; and
a void formed in the second dielectric layer, with a bottom of the void stopping on the cap layer, wherein the void is located in a manner so as to isolate structural damage due to electromigration effects of the first metal line, the effects including one or more of extrusions of metal material from the first metal line and cracks from delamination of the cap layer with respect to the first dielectric layer.

4. The structure of claim 3, further comprising a sealing dielectric material formed over the second dielectric layer, the sealing dielectric material configured to pinch off upper portions of the void while maintaining lower portions of the void.

5. The structure of claim 3, wherein the void is localized around an anode end of the first metal line so as to prevent extrusions from the anode end from shorting to an adjacent second metal line formed in the first dielectric layer.

6. The structure of claim 3, further comprising a pair of voids localized around opposing ends of the first metal line.

7. The structure of claim 3, further comprising a pore-sealing liner material formed on sidewall surfaces of the second dielectric layer that define the void.

8. The structure of claim 3, wherein the second dielectric layer comprises a porous, low-K material.

9. A semiconductor device structure, comprising:
a first wiring level, the first wiring level comprising a first metal line formed in a first dielectric layer, and a second metal line formed in the first dielectric layer, adjacent the first metal line;
a first cap layer formed over the first wiring level; and
a second wiring level formed over the first cap layer, the second wiring level comprising a second dielectric layer, a void formed in the second dielectric layer, with a bottom of the void stopping on the first cap layer, and sealing dielectric material formed over the second cap layer, the sealing dielectric material configured to pinch off upper portions of the void while maintaining lower portions of the void;
wherein the void is located in a manner so as to isolate structural damage due to electromigration effects of the first metal line, the effects including one or more of extrusions of metal material from the first metal line and cracks from delamination of the first cap layer with respect to the first dielectric layer.

10. The structure of claim 9, wherein the void is localized around an anode end of the first metal line so as to prevent extrusions from the anode end from shorting to the adjacent second metal line.

11. The structure of claim 9, further comprising a pair of voids localized around opposing ends of the first metal line.

12. The structure of claim 9, further comprising a pore-sealing liner material formed on sidewall surfaces of the second dielectric layer that define the void.

13. The structure of claim 9, wherein the first and second dielectric layers comprise a porous, low-K material.

* * * * *